United States Patent [19]

Kurose et al.

[11] Patent Number: 5,657,441
[45] Date of Patent: Aug. 12, 1997

[54] SELF-DIAGNOSIS PROGRAM STORAGE UNIT DETACHABLY CONNECTED TO A PROGRAMMABLE DEVICE

[75] Inventors: Yoshikazu Kurose; Takayuki Horikoshi, both of Kanagawa, Japan

[73] Assignee: Sony Corporation, Tokyo, Japan

[21] Appl. No.: 501,776

[22] Filed: Jul. 13, 1995

Related U.S. Application Data

[63] Continuation of Ser. No. 142,861, Oct. 28, 1993, abandoned.

[30] Foreign Application Priority Data

Oct. 31, 1992 [JP] Japan ..................... 4-316364

[51] Int. Cl.[6] ........................................... G06F 9/455
[52] U.S. Cl. ........................................... 395/183.04
[58] Field of Search ................ 395/183.04; 364/474.16, 364/474.19, 551.01, 579, 580, 267.4

[56] References Cited

U.S. PATENT DOCUMENTS

| | | | |
|---|---|---|---|
| 4,317,199 | 2/1982 | Winslow | 395/183.05 |
| 4,455,654 | 6/1984 | Bhaskar et al. | 371/20 |
| 4,489,414 | 12/1984 | Titherley | 371/21.6 |
| 4,691,316 | 9/1987 | Phillips | 371/20 |
| 4,796,258 | 1/1989 | Boyce et al. | 395/183.06 |
| 4,993,027 | 2/1991 | McGraw et al. | 371/16.2 |
| 5,019,996 | 5/1991 | Lee | 364/483 |
| 5,228,039 | 7/1993 | Knoke et al. | 371/19 |

Primary Examiner—Robert W. Beausoliel, Jr.
Assistant Examiner—Stephen C. Elmore
Attorney, Agent, or Firm—Jay H. Maioli

[57] ABSTRACT

A circuit board unit that has a number of data processing blocks and a programmable logic array that controls the operation of the processing blocks to perform respective processing operations includes an external self-diagnosis program storage device connected through an interface unit to the programmable logic array, so that when the program storage device is connected a self-diagnosis program is fed to the programmable logic array that then causes the processing blocks to perform a self-diagnosis operation.

7 Claims, 1 Drawing Sheet

SELF-DIAGNOSIS PROGRAM STORAGE UNIT DETACHABLY CONNECTED TO A PROGRAMMABLE DEVICE

This is a continuation of application Ser. No. 08/142,861 filed Oct. 28, 1993, now abandoned.

BACKGROUND OF THE INVENTION

1. Field of the Invention

This invention relates to a circuit board unit, and more particularly to an improved circuit board unit that executes a self-diagnosis program.

2. Description of the Related Art

Heretofore, in systems employing circuit boards including an electrically rewritable programmable device, there is an internal circuit board in which the read only memory (ROM) of the central processing unit (CPU) mounted on the main body of the system outside of the circuit board is changed, or an external system having another CPU is connected so as to change the program to be down-loaded while communicating with the CPU of the main body of the system. Thereby, the operation of the circuit board of interest can be self-diagnosed.

However, in the construction of such circuit board systems, there is a problem that it requires alot of troublesome labor due to the use of the system connected externally to the circuit board. In addition the problem is presented that the system becomes large in physical size. Further, there is a problem that the program of the circuit board of interest cannot be changed easily, because to satisfy the detailed functions of changing only the program of the programmable device, the processing loads on the other functions such as the control of the main body of the system etc., are heavy. As a result, in many cases, this processing load affects even the system of the main body.

SUMMARY OF THE INVENTION

In view of the foregoing, an object of this invention is to provide a circuit board unit in which the program of the programmable device contained therein can be easily changed in order to perform a self-diagnosis operation.

The foregoing object and other objects of this invention have been achieved by the provision of a circuit board unit having a programmable device and in which a system is re-constructed corresponding to a program loaded in the programmable device, which executes a predetermined processing with other data processing blocks, connected to an interface for normal operation and/or to a small board connector. A so-called small board is connected to the small board connecter, so as to load a self-diagnosis program stored on the small board at the time of power-on or system reset and to execute the self-diagnosis operation using the programmable device on the circuit board unit.

Further, in this invention the small board is changed to a different small board which has stored thereon a self-diagnosis program differing from the original program for self-diagnosis, in order to execute another self-diagnosis operation using the programmable device at the time of power-on or system reset.

Furthermore, in this invention the programmable device performs corresponding to the program loaded from the interface for normal operation as a processing block.

With respect to a programmable device provided on a circuit board, a small board is connected to a connector that is different than the normal interface connector, and a self-diagnosis program stored on the small board is loaded at the time of power-on or system reset, in order to execute the self-diagnosis operation using the programmable device. Thereby, various self-diagnoses for the circuit board can be executed easily just by changing the program of the programmable device.

According to the present invention, a small board is connected to a connector different than the normal interface connector, and a self-diagnosis program stored in a ROM on the small board is loaded at the time of power-on or system reset to execute the self-diagnosis operation using the programmable device. In this manner, a circuit board unit that can execute easily various self-diagnoses just by changing the program of the programmable device can be realized.

The nature, principle and utility of the invention will become more apparent from the following detailed description when read in conjunction with the accompanying drawings in which like parts are designated by like reference numerals or characters.

DETAILED DESCRIPTION OF PREFERRED EMBODIMENTS

Figure 1:
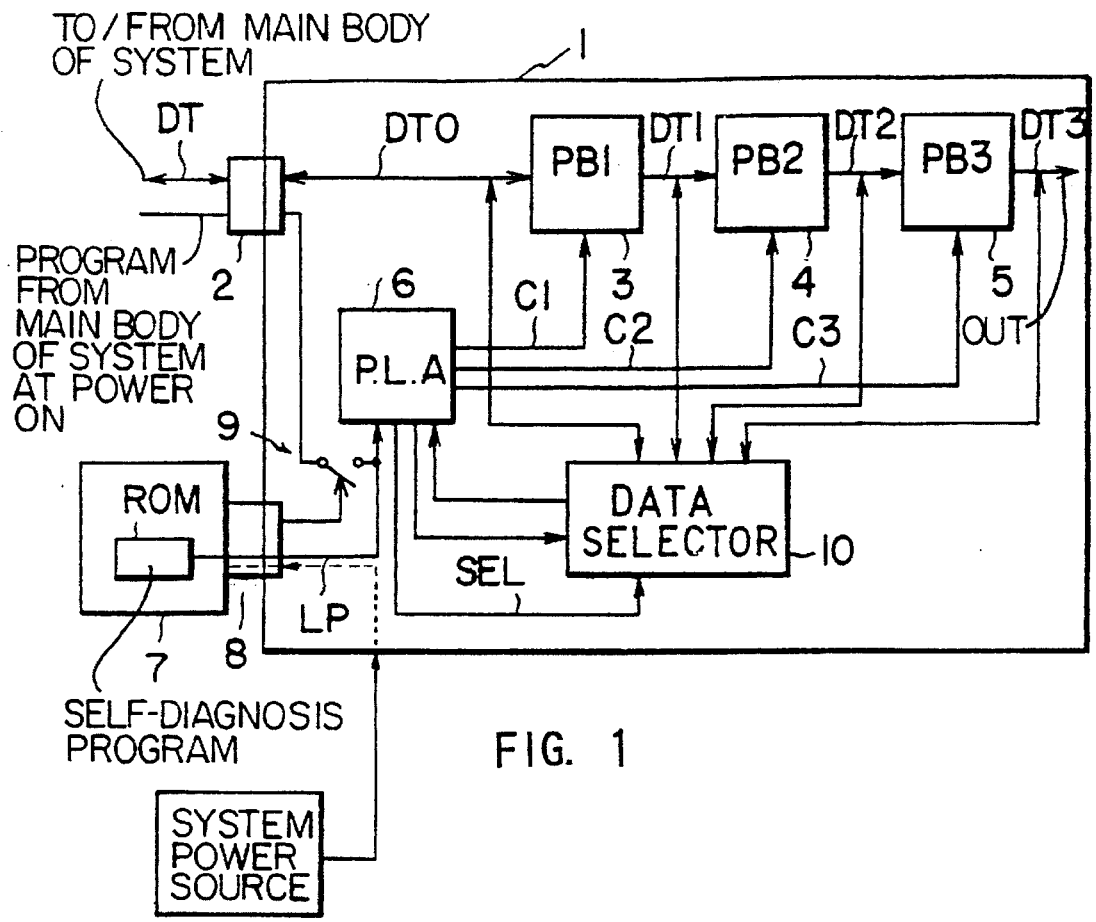
FIG. 1 is a block diagram showing one embodiment of a circuit board unit according to the invention.

Preferred embodiments of this invention will be described with reference to the accompanying drawings:

In FIG. 1, 1 generally designates a circuit board unit of this invention. The circuit board unit 1 is composed of a plurality of processing blocks (PB1, PB2, PB3) 3, 4, and 5, which sequentially process data DT (DT0, DT1, DT2, ... ) fed in via a first connector 2, and a programmable logic array (P.L.A.) 6 that can easily load programs from the outside and that functions as a programmable device.

As the normal, non-diagnosis operation, at the time of power-on or reset of the main body of the system (not shown) connected to the circuit board unit 1 via the connector 2, a predetermined program is loaded to the programmable logic array 6. The programmable logic array 6 controls the processing blocks 3, 4, and 5 according to its constructed logic and the loaded program to cause the circuit board unit 1 to execute a predetermined operation as the circuit board unit 1.

In this embodiment of the circuit board unit 1, a second connector 8 is provided for connection to a so-called small board 7 and is in addition to the first connector 2 that is connected with the main body of the system. The power for the small board 7 is supplied from the side of the circuit board unit 1 via the connector 8, and the connection with the main body through which a program is loaded to the programmable logic array 6 is electrically separated by a switch 9 controlled by a connection from the small board 7.

The ROM that stores the program to be down loaded is mounted on the small board 7, so that when the power is supplied to the small board 7 from the power source 11 that supplies power to the circuit board unit 1, the program in the ROM is automatically loaded to the programmable logic array 6 via the connector 8.

The programmable logic array 6 provides self-diagnosis check signals C1, C2, and C3 to the respective processing blocks 3, 4, and 5 which the programmable logic array 6 normally controls, as completely different signals from the normal signals, and then receives their response so as to judge whether the operations of the respective circuits are normal or not.

Further, in this embodiment, a data selector circuit 10 is mounted on the circuit board unit 1, in order to check that data DT0, DT1, and DT2 are respectively supplied to the processing blocks 3, 4, and 5, as well as checking that data DT1, DT2, and DT3 are respectively output by the processing blocks 3, 4, and 5, on the basis of the instructions supplied from the programmable logic array 6. The data selector 10 is controlled by a selecting signal SEL sent from the programmable logic array 6.

In the above construction, when executing a self-diagnosis operation on the circuit board unit 1, the small board 7 that includes the ROM having the self-diagnosis program is connected to the connector 8, and then the user turns on the power source of the main body of the system or resets it. Thereafter, the programmable logic array 6 is operated corresponding to the self-diagnosis program that was stored in the ROM so that a self-diagnosis can be performed with as small an influence as possible with respect to the CPU of the main body of the system.

Further, if a different program is desired to be executed for the purpose of self-diagnosis, it can be provided by only changing the small board 7 to another one having a ROM with a different program, and then turning on the power source of the main body of the system or resetting it. Thereby, various self-diagnoses can be executed in accordance with the changes in the program, thus it can easily execute the analysis of circuit trouble, etc.

According to the above construction, with respect to the programmable logic array 6 that normally operates corresponding to the program loaded from the outside via the first connector 2, the small board 7 is connected to the second connector 8 provided on the board, so as to load the self-diagnosis program which has been stored in the ROM of the small board 7 to execute the self-diagnosis. Thereby, the circuit board unit 1 can be realized wherein self-diagnosis of the internal circuit elements can be executed simply by changing the program in the programmable logic array 6.

Further, according to the above construction, the programmable logic array 6 normally operates corresponding to the program loaded from the outside via the first connector 2, thereby preventing the construction on the board from becoming complicated when only performing self-diagnosis. Thereby, a circuit board unit 1 wherein the self-diagnosis function can be obtained with only a simple construction can be realized.

Further, in the above construction by changing the small boards 7 in which different self-diagnosis programs are respectively stored in the ROMs, a circuit board unit 1 in which various self-diagnoses can be executed with simple operations, so as to improve its usability in particular can be realized.

Note that in the above embodiments, the programmable logic array is provided on the circuit board so as to control normal operations, as well as to diagnose the operation of the other processing blocks on the circuit board. However, the other processing blocks themselves may be composed of programmable logic arrays, so as to self-diagnose each other.

Figure 2:
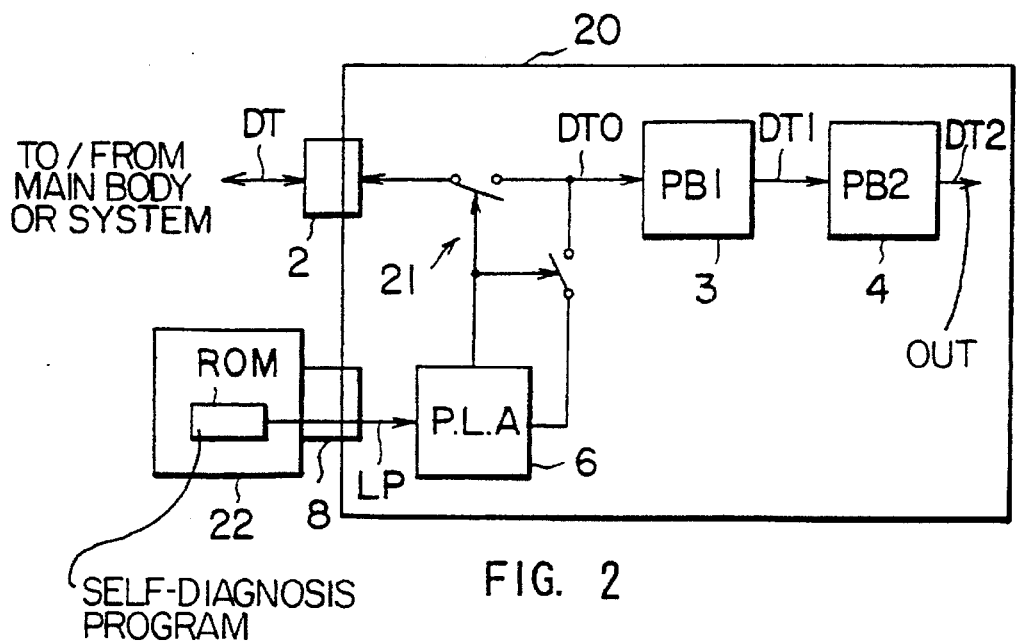
FIG. 2 is a block diagram showing the circuit board unit according to another embodiment.

As shown in FIG. 2, the programmable logic array may be provided on the circuit board unit 20 exclusively for performing self-diagnosis. In this case when a small board 22 is connected to the second connector 8, it operates to perform self-diagnosis of the operation of the circuit board by using the programmable logic array 6.

In this case in normal non-self-diagnosis operation it is similar to the construction of FIG. 1, however, the small board 7 is connected without down-loading the program from the CPU of the main body with respect to the programmable logic array 6, in order to perform self-diagnosis by using the programmable logic array 6.

Furthermore, in the above embodiments, the programmable logic array is used as the programmable device, however, instead of this, devices such as flash memory, electronically erasable programmable logic array, or ROM, etc., may be used.

While the above description has been provided in connection with the preferred embodiments of the invention, it will be obvious to those skilled in the art that various changes and modifications may be made. Therefore, the appended claims are intended to cover all such changes and modifications as fall within the true spirit and scope of the invention.

What is claimed is:

1. A circuit board unit within a processing system including a main portion external to said circuit board unit, comprising:

a circuit board having processing blocks for processing data;

a programmable device mounted on said circuit board which includes programmable logic circuits that are programmed at a time of power-on or reset of said processing system in accordance with one of a non-diagnostic processing operation program and a self-diagnosis program to control, respectively, a non-diagnostic processing operation and a self-diagnosis operation of said processing blocks;

a first interface connector mounted on said circuit board for connecting said circuit board with said main portion of said processing system, through which said non-diagnostic processing operation program is supplied by said main portion of said processing system to said programmable device at said time of power-on or reset of said processing system, and through which other data are supplied by said main portion of said processing system to said processing blocks;

a self-diagnosis program storage device external to said circuit board and distinct from said main portion, for storing said self-diagnosis program and for automatically supplying said self-diagnosis program when power is supplied to said self-diagnosis program storage device, independent of any communication from or control by another device; and a second interface connector mounted on said circuit board for connecting said circuit board with said self-diagnosis program storage device external to said circuit board, and through which said self-diagnosis program is supplied to said circuit board by said self-diagnosis program storage device external to said circuit board at said time of power-on or reset of said processing system.

2. A circuit board unit according to claim 1, wherein said programmable logic circuits of said programmable device control said processing blocks to execute said non-diagnostic processing operation in accordance with said non-diagnostic processing operation program programmed into said programmable logic circuits of said programmable device if said self-diagnosis program storage device is not connected to said second interface connector at said time of power-on or reset of said processing system.

3. A circuit board unit according to claim 1, wherein said programmable logic circuits of said programmable device is programmed in accordance with said self-diagnosis program of said self-diagnosis program storage device at said time of power-on or reset of said processing system if said external self-diagnosis program storage device is physically connected to said circuit board via said second interface connector, and said programmable logic circuits of said programmable device controls said processing blocks to execute said self-diagnosis operation in accordance with said self-diagnosis program.

4. A circuit board unit according to claim 1, further comprising:

switching means for electrically disconnecting said programmable device from said first interface connector and electrically connecting said programmable device to said second interface connector when said circuit board is physically connected via said second interface connector to said self-diagnosis program storage device.

5. A circuit board unit according to claim 1, wherein said programmable logic circuits of said programmable device control said processing blocks to perform self-diagnosis in accordance with said self-diagnosis program programmed in said programmable logic devices of said programmable device if said external self-diagnosis program storage device is connected to said circuit board via said second interface connector.

6. A circuit board unit according to claim 1, wherein said self-diagnosis program storage device includes a read only memory for storing said self-diagnosis program.

7. A circuit board unit according to claim 6, wherein power is supplied from said circuit board to said self-diagnosis program storage device via said second interface connector when said self-diagnosis program storage device is connected to said circuit board via said second interface connector so that said self-diagnosis program storage device can supply said self-diagnosis program stored in said read only memory of said self-diagnosis program storage device to said programmable device, and so that said programmable logic circuits of said programmable device control said processing blocks in accordance with said self-diagnosis program.

* * * * *